(12) United States Patent
Wakiya et al.

(10) Patent No.: US 7,129,020 B2
(45) Date of Patent: Oct. 31, 2006

(54) LIQUID COATING COMPOSITION FOR FORMING A TOP ANTIREFLECTIVE FILM AND PHOTORESIST LAMINATE USING THE SAME, AS WELL AS METHOD FOR FORMING PHOTORESIST PATTERN

(75) Inventors: Kazumasa Wakiya, Kanagawa-ken (JP); Naotaka Kubota, Kanagawa-ken (JP); Shigeru Yokoi, Kanagawa-ken (JP); Takayuki Haraguchi, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/443,746

(22) Filed: May 23, 2003

(65) Prior Publication Data

US 2003/0219682 A1    Nov. 27, 2003

(30) Foreign Application Priority Data

May 24, 2002    (JP) .............................. 2002-150172

(51) Int. Cl.
  *G03F 7/11*    (2006.01)
(52) U.S. Cl. ................................. 430/273.1; 430/270.1
(58) Field of Classification Search ............. 430/270.1, 430/273.1, 325
  See application file for complete search history.

(56) References Cited

U.S. PATENT DOCUMENTS

| 5,611,850 | A | * | 3/1997 | Nishi et al. ............. 106/287.26 |
| 5,853,471 | A | * | 12/1998 | Yoshida et al. ........ 106/287.13 |
| 6,027,856 | A | * | 2/2000 | Nozaki et al. ........... 430/281.1 |
| 6,309,789 | B1 | | 10/2001 | Takano et al. |
| 6,692,892 | B1 | * | 2/2004 | Takano et al. ........... 430/270.1 |

FOREIGN PATENT DOCUMENTS

CN    1272864 A    11/2000

\* cited by examiner

*Primary Examiner*—Amanda Walke
(74) *Attorney, Agent, or Firm*—Wenderoth, Lind & Ponack, L.L.P.

(57) ABSTRACT

Disclosed is a liquid coating composition for forming a top antireflective film that contains a polymer, the polymer containing, as a structural unit, a (meth)acrylate unit that has at least one polycyclic hydrocarbon group on its side chain and becomes more soluble to alkali by the action of an acid, the liquid coating composition comprising: (a) a water-soluble, film-forming component; (b) at least one fluorine-based compound selected from a perfluoroalkylcarboxylic acid having 4 or more carbon atoms and a perfluoroalkyl-sulfonic acid having 5 or more carbon atoms; and (c) a fluoroalkylsulfonic acid having 1–4 carbon atoms and/or an acidic compound consisting of a hydrocarbon having 1–4 carbon atoms in which one or more hydrogen atoms are substituted with a fluoloalkylsulfonyl group(s), with the proviso that one or more carbon atoms therein may be substituted with a nitrogen atom(s).

6 Claims, No Drawings

LIQUID COATING COMPOSITION FOR FORMING A TOP ANTIREFLECTIVE FILM AND PHOTORESIST LAMINATE USING THE SAME, AS WELL AS METHOD FOR FORMING PHOTORESIST PATTERN

BACKGROUND OF THE INVENTION

1. Field of the Invention

The present invention relates to a liquid coating composition for forming an antireflective film deposited on top of a photoresist layer and to a photoresist laminate formed by making use of such a coating composition, as well as to a method for forming a photoresist pattern. More particularly, the present invention relates to a liquid coating composition for forming a top antireflective film, which, when used in the pattern formation process by the photolithography technique in which ArF excimer laser (with a wavelength of 193 nm) is utilized as activation light, can serve to reduce the multiple interference of light within the photoresist layer, thus ensuring high accuracy of the resulting photoresist pattern, and to a photoresist laminate using the composition, as well as to a method for forming a photoresist pattern.

2. Description of Related Art

As semiconductor devices are becoming ever more highly integrated, new techniques have been developed that are adapted to fine processing required in the production of semiconductor devices. The same is also true for the photolithography process, a key process in the production of semiconductor devices, where strong demand exists for further improvements in fine processing. To that end, various approaches have been attempted for forming ultrafine photoresist patterns by taking advantage of photoresist materials that function with short-wavelength radiations such as KrF, ArF, and $F_2$ excimer lasers.

Recently, a significant amount of effort has gone into developing a ultrafine processing technique that employs activation light with a wavelength of 200 nm or shorter, in particular, ArF excimer laser light (193 nm in wavelength), and it has now become an important technical challenge to form even finer high-precision photoresist patterns by using particular photoresists that are adapted to be used with ArF excimer laser.

One known method designed to form photoresist patterns by means of photolithography involves deposition of an antireflective film (top antireflective film) on top of the photoresist film prior to exposure, and following development of the photoresist. In this manner, the multiple interference of light that takes place within the photoresist film can be prevented and, as a result, the variation in the width of the geometrical features of a photoresist pattern, which results from the variation in the thickness of the photoresist film, can be minimized.

In an effort to improve the above-described process, various proposals have been made concerning materials of the antireflective film and the photoresist film that are optimum for the formation of ultrafine patterns. For example, a technique described in JP-8-292565A employs as the antireflective film material a specific composition containing two different types of fluorine-based compositions. This technique has brought about a considerable improvement in the dimensional accuracy of the photoresist patterns without leading to an increase in the number of steps involved in the process or a reduction in the sensitivity of the photoresist. Another technique described in JP-10-3001A combines advantages of antireflectivity and stability of the coating over time. Each of these approaches, however, is directed to preventing the reflection in certain types of photoresists adapted to use with i-ray or g-ray, and none of them have proven effective when used in conjunction with the newly developed photoresists intended for use with ArF excimer laser. It is thus considered difficult to apply any of these conventional approaches to photoresist materials designed for use with ArF excimer laser to accurately form ultrafine photoresist patterns that are required in the production of today's integrated circuits.

On the other hand, certain types of photoresist materials, known as chemically amplified photoresists, have become increasingly used in photoresist film. A typical chemically amplified photoresist contains a base resin and an acid-generating agent which generates an acid upon exposure to radiation. Among known chemically amplified photoresist compositions, those that contain, as the base resin, a resin containing a (meth)acrylate unit that has at least one polycyclic hydrocarbon on its side chain and, as the acid-generating agent, an onium salt-based agent, in particular, one containing sulfonate ions, such as nonafluorobutane sulfonate ions and trifluoromethane sulfonate ions, are known to be suitable for use with ArF excimer laser.

SUMMARY OF THE INVENTION

As described above, while considerable effort has been made to independently find suitable materials for the antireflective film and for the photoresist film for the purpose of forming finer patterns, little attention has been directed toward finding optimum combinations of antireflective film and photoresist film. Seeking individual solutions for the photoresist film and the top antireflective film has proven less practical, considering the recent requirements for the ultrafine pattering, especially when it is desired to form ultrafine patterns by means of activation light with a wavelength of 193 nm. It is thus necessary to examine potential synergic effects of combinations of the two. When a traditional top antireflective film is used with ArF excimer laser to form the ultrafine photoresist pattern, top portions of the resulting photoresist patterns are not properly edged or their cross-sectional shapes are not rectangular: top portions of the result photoresist patterns tend to be overhung, T-shaped in using a positive photoresist, whereas top portions of the result photoresist patterns tend to be rounded off in using a negative photoresist. While some attempts have been made to modify resins contained in the photoresist materials to address this problem, such attempts have given rise to other problems, including decreased focal depths.

Accordingly, it is an objective of the present invention to solve the aforementioned problem in the formation of fine photoresist patterns using an ArF excimer laser-capable positive photoresist and a top antireflective film, in which the resulting photoresist pattern features tend to be overhung, T-shaped top portions and may be interconnected to one another.

To achieve the above-described objective, one aspect of the present invention provides a liquid coating composition for forming an antireflective film overlaid on top of a photoresist layer that contains a polymer, the polymer containing, as a structural unit, a (meth)acrylate unit that has at least one polycyclic hydrocarbon group on its side chain and becomes more soluble to alkali by the action of an acid, the coating composition comprising:

(a) a water-soluble, film-forming component;
(b) at least one fluorine-based compound selected from the group consisting of a perfluoroalkylcarboxylic acid having 4 or more carbon atoms and a perfluoroalkylsulfonic acid having 5 or more carbon atoms; and (c): (c-1) a fluoroalkylsulfonic acid having 1–4 carbon atoms; and/or (c-2) an acidic compound consisting of a hydrocarbon having 1–4 carbon atoms in which one or more hydrogen atoms are substituted with a fluoloalkylsulfonyl group(s), with the proviso that one or more carbon-atoms in the hydrocarbon may be substituted with a nitrogen atom(s).

In another aspect, the present invention provides a photoresist laminate comprising:

a photoresist layer containing a polymer, the polymer containing, as a structural unit, a (meth)acrylate unit that have at least one polycyclic hydrocarbon group on its side chain and becomes more soluble to alkali by the action of an acid; and an antireflective film deposited on top of the photoresist layer, the antireflective film being formed of the above-described coating composition.

In a further aspect, the present invention provides a method for forming a photoresist pattern, comprising:

depositing the photoresist laminate on a substrate;

selectively exposing the photoresist laminate to activation light with a wavelength of 193 nm; and developing the photoresist laminate to form a photoresist pattern.

DETAILED DESCRIPTION OF THE INVENTION

The present invention will now be described in detail.

Examples of the above-described water-soluble, film-forming component (a) in the liquid coating composition for forming an antireflective film according to the invention include, but are not limited to, cellulose polymers, such as hydroxypropyl methylcellulose phthalate, hydroxypropyl methylcellulose acetate phthalate, hydroxypropyl methylcellulose acetate succinate, hydroxypropyl methylcellulose hexahydrophthalate, hydroxypropyl methylcellulose, hydroxypropylcellulose, hydroxyethylcellulose, cellulose acetate hexahydrophthalate, carboxymethylcellulose, ethylcellulose and methylcellulose; acrylic acid-based polymers consisting of monomer units such as N,N-dimethylacrylamide, N,N-dimethylaminopropylmethacrylamide, N,N-dimethylaminopropylacrylamide, N-methylacrylamide, diacetoneacrylamide, N,N-dimethylaminoethylmethacrylate, N,N-diethylaminoethylmethacrylate, N,N-dimethylaminoethylacrylate, acryloyl morpholine and acrylic acid; and vinyl-based polymers, such as polyvinyl alcohol and polyvinylpyrrolidone. Of these, acrylic acid-based polymers and polyvinylpyrrolidone, each being a water-soluble polymer having no hydroxyl groups within the molecule, are preferred, with polyvinylpyrrolidone being particularly preferred. These compounds may be used individually or in combinations of two or more to serve as the water-soluble, film-forming component.

The fluorine-based compound as component (b) includes at least one selected from a perfluoroalkylcarboxylic acid having 4 or more carbon atoms and a perfluoroalkylsulfonic acid having 5 or more carbon atoms.

The "perfluoroalkylcarboxylic acid having 4 or more carbon atoms" refers to an alkylcarboxylic acid in which each of the alkyl groups having 4 or more carbon atoms has all of its hydrogen atoms substituted with fluorine atoms. The carboxylic acid may include di-, tri-, or other polycarboxylic acids. Examples of perfluoroalkylcarboxylic acid include perfluoroheptanoic acid, perfluorooctanoic acid, octafluoroadipic acid (=perfluoroadipic acid), dodecafluorosuberic acid (=perfluorosuberic acid), and tetradecafluoroazelaic acid (=perfluoroazelaic acid).

The "perfluoroalkylsulfonic acid having 5 or more carbon atoms" refers to an alkylsulfonic acid in which each of the alkyl groups having 4 or more carbon atoms have all of its hydrogen atoms substituted with fluorine atoms. The sulfonic acid may include di-, tri-, or other polysulfonic acids. Examples of perfluoroalkylsulfonic acid include perfluorooctylsulfonic acid and perfluorodecylsulfonic acid, etc.

Among these, perfluorooctanoic acid and perfluorooctylsulfonic acid are particularly preferred because of their ability to prevent interference, solubility to water, and readiness in adjusting pH. Perfluorooctanoic acid and perfluorooctylsulfonic acid are commercially available from Tochem Products Co., Ltd., under the product names of "EF-201" and "EF-101", respectively. These products can be suitably used.

In general, the aforementioned fluorine-based compounds are mixed with a base for use. Preferred examples of the base include, but are not limited to, at least one selected from a quaternary ammonium hydroxide and an alkanolamine. Examples of the quaternary ammonium hydroxide include tetramethylammonium hydroxide (TMAH), (2-hydroxyethyl)trimethylammonium hydroxide (=choline). Examples of the alkanolamine include monoethanolamine, N-methylethanolamine, N-ethylethanolamine, diethanolamine, and triethanolamine.

Component (c) is at least one compound selected from: (c-1) a fluoroalkylsulfonic acid having 1–4 carbon atoms; and/or (c-2) an acidic compound consisting of a hydrocarbon having 1–4 carbon atoms in which one or more hydrogen atoms are substituted with a fluoloalkylsulfonyl group (s), with the proviso that one or more carbon atoms in the hydrocarbon may be substituted with a nitrogen atom(s).

Examples of component (c-1) include trifluoromethansulfonic acid, pentafluoroethanesulfonic acid, heptafluoropropanesulfonic acid, hexafluoropropanedisulfonic acid, heptafluoroisopropanesulfonic acid, and nonafluorobutanesulfonic acid. Of these, nonafluorobutanesulfonic acid and hexafluoropropanedisulfonic acid are preferred because of their availability.

Examples of component (c-2) include tris(trifluoromethylsulfonyl)methane, bis(trifluoromethylsulfonyl)ammonium, and bis(heptafluoroethylsulfonyl)ammonium, with tris(trifluoromethylsulfonyl)methane particularly preferred.

Component (c) may be any one or any combination of two or more components selected from components (c-1) and components (c-2).

The characteristic of the composition of the present invention lies in the incorporation of component (c) in addition to components (a) and (b). In forming photoresist patterns, the incorporation of component (c) not only helps eliminate the problem of defective profile of top portions of the resulting photoresist patterns, but it also improves the coating performance of the coating composition when the composition is used in combination with the underlying layer formed of an ArF excimer laser-capable photoresist, i.e., a photoresist specially designed for use with ArF excimer laser to serve as exposure light.

The liquid coating composition for forming an antireflective film of the present invention can effectively prevent the formation of the overhung, T-shaped top portions of the resulting photoresist patterns, which is particularly significant when a positive ArF photoresist is used in conjunction with the top antireflective layer.

The liquid coating composition of the present invention for forming an antireflective film, which contains as essential components the above-described components (a), (b), and (c), is typically used in the form of aqueous solution. Preferably, such an aqueous solution is prepared to have a concentration of the solid component of 0.5–20% by mass.

The amount of component (a) in the liquid coating composition is preferably 0.5–10% by mass.

The amount of component (b) in the liquid coating composition is preferably 0.5–20% by mass, in particular, 1–10% by mass. The base is preferably mixed with component (b) in a proper amount so that the pH of the final product of the liquid coating composition does not fall outside the range of 1.5–1.9.

The amount of component (c) in the liquid coating composition is preferably 0.1–1.5% by mass and, more preferably, 0.2–0.8% by mass. An excessive amount of component (c) may result in a reduced coating performance, whereas too small an amount of component (c) may bring about excessively high pH of the coating composition and can thus decrease the ability of the coating composition to provide well-defined photoresist patterns, in particular, the ability to eliminate the T-shaped top portions of the photoresist patterns.

As described above, while the liquid coating composition of the present invention is typically used in the form of aqueous solution, an alcohol-based organic solvent may optionally be added since the addition of the alcohol-based organic solvent, such as isopropyl alcohol and trifluoroethanol, enhances the solubility of component (b) and component (c), and thus improves the uniformity of the coating. The amount of the alcohol-based organic solvent is preferably added up to 20% by mass with respect to the total amount of the liquid coating composition.

In addition to components (a), (b) and (c), the liquid coating composition of the present invention may optionally further contain, if necessary, an N-alkyl-2-pyrrolidone surfactant.

A preferred N-alkyl-2-pyrrolidone surfactant is a compound represented by the following general formula (I):

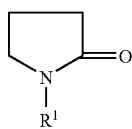

(I)

wherein $R_1$ is an alkyl group having 6–20 carbon atoms.

Specific examples of the compound of the general formula (I) include N-hexyl-2-pyrrolidone, N-heptyl-2-pyrrolidone, N-octyl-2-pyrrolidone, N-nonyl-2-pyrrolidone, N-decyl-2-pyrrolidone, N-undecyl-2-pyrrolidone, N-dodecyl-2-pyrrolidone, N-tridecyl-2-pyrrolidone, N-tetradecyl-2-pyrrolidone, N-pentadecyl-2-pyrrolidone, N-hexadecyl-2-pyrrolidone, N-heptadecyl-2-pyrrolidone, and N-octadecyl-2-pyrrolidone. Of these, N-octyl-2-pyrrolidone and N-dodecyl-2-pyrrolidone are marketed by ISP JAPAN Co., Ltd., under the product names of "SURFADONE LP100" and "SURFADONE LP300", respectively, and are preferred for their availability. Addition of this compound enhances coatability of the composition, so that uniform coating can be obtained to the edges of the substrate while requiring a minimum amount of the coating.

The said compound is preferably added in an amount of 100–10,000 ppm, particularly 150–5,000 ppm, with respect to the amount of the liquid coating composition in which components (a), (b), and (c) have been dissolved.

The top antireflective film formed of the liquid coating composition of the present invention is intended to be used in combination with an underlying photoresist layer that is designed for use with ArF excimer laser radiation (wavelength=193 nm) to form desired photoresist patterns. The two-layered structure of the photoresist layer and the antireflective film provides the photoresist laminate of the present invention.

The photoresist layer contains a polymer that contains, as a structural unit, a (meth)acrylate unit that has at least one polycyclic hydrocarbon group on its side chain and becomes more soluble to alkali by the action of an acid.

The "(meth)acrylate unit that has at least one polycyclic hydrocarbon group on its side chain and becomes more soluble to alkali by the action of an acid" is exemplified by a compound represented by the following general formula (II):

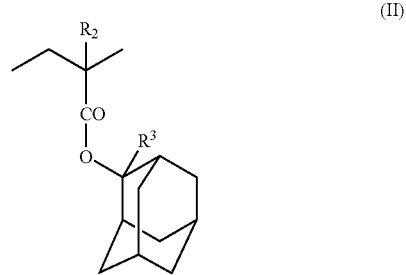

(II)

In addition to the (meth)acrylate unit, the polymer preferably contains, as additional structural units, a (meth)acrylate unit including a monocyclic or polycyclic group having a lactone moiety, a (meth)acrylate unit including a polycyclic group having a hydroxyl group, or a (meth)acrylate unit including a hydroxyl group, an alkoxyl group or an acyl group.

The (meth)acrylate unit including a monocyclic or polycyclic group having a lactone moiety is exemplified by a compound represented by the following general formula (III):

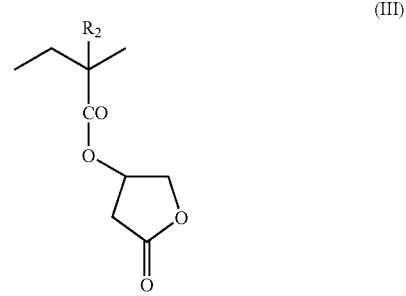

(III)

The (meth)acrylate unit including a polycyclic group having a hydroxyl group is exemplified by a compound represented by the following general formula (IV):

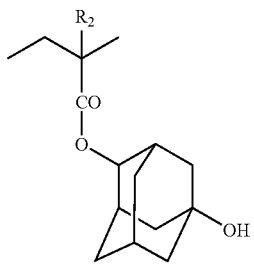

(IV)

The (meth)acrylate unit including a hydroxyl group, an alkoxyl group or an acyl group is exemplified by a compound represented by the following general formula (V):

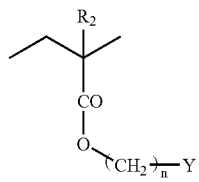

(V)

In each of the general formulae (II)–(V) above, $R_2$ is a hydrogen atom or methyl group, $R_3$ is an alkyl group having 1–5 carbon atoms, n is an integer of 2–18, and Y is a hydroxyl group, an alkoxyl group or an acyl agoup.

In addition to the above-described polymer, the ArF photoresist layer for use in the present invention contains an acid-generating agent that generates an acid when exposed to light or other activation energy ray.

The acid-generating agent is preferably an onium salt containing a fluoroalkyl sulfonic acid ion having 1–5 carbon atoms to serve as anion. The cation to form the onium salt may be optionally selected from among any known cations. For example, the cation may be a phenyl iodonium or sulfonium, which may be substituted with a lower alkyl group, such as methyl, ethyl, propyl, n-butyl, and tert-butyl or a lower alkoxy group such as methoxy and ethoxy.

The anion of the onium salt, on the other hand, is a fluoroalkylsulfonic acid ion that has an alkyl group having 1–5 carbon atoms with some or all of its hydrogen atoms substituted with fluorine atoms. Since the acidity of the fluoroalkylsulfonic acid tends to decrease as its carbon chain becomes longer and its fluoridation rate (i.e., the proportion of fluorine atoms in the alkyl group) becomes smaller, it is preferred to use ions of perfluoroalkylsulfonic acid having an alkyl group of 1–4 carbon atoms with all of its hydrogen atoms substituted with fluorine atoms.

Examples of such an onium salt include an iodonium salt represented by the following general formula (VI):

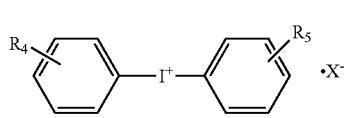

(VI)

wherein $R_4$ and $R_5$ are each independently a hydrogen atom, an alkyl group having 1–4 carbon atoms, methoxy group or ethoxy group, and $X^-$ is a fluoroalkylsulfonic acid ion having 1–5 carbon atoms; and a sulfonium salt represented by the following general formula (VII):

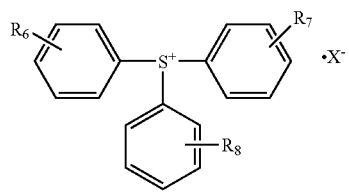

(VII)

wherein $R_6$, $R_7$ and $R_8$ are each independently a hydrogen atom, an alkyl group having 1–4 atoms, methoxy group or ethoxy group; and $X^-$ is a fluoroalkylsulfonic acid ion having 1–5 carbon atoms.

Preferred examples of the onium salt include diphenyliodonium trifluoromethanesulfonate, diphenyliodonium nonafluorobutanesulfonate, bis(4-tert-butylphenyl)iodonium nonafluorobutanesulfonate, triphenylsulfonium nonafluorobutanesulfonate, and tri(4-methylphenyl)sulfonium nonafluorobutanesulfonate. Of these, particularly preferred are diphenyliodonium trifluoromethanesulfonate, diphenyliodonium nonafluorobutanesulfonate, and bis(4-tert-butylphenyl)iodonium nonafluorobutanesulfonate. These acid-generating agents may be used either individually or in combination of two or more.

The amount of the acid-generating agent is preferably in the range of 1–20 parts by mass with respect to 100 parts by mass of the above-described polymer. The amount of the acid-generating agent less than 1 part by mass makes it difficult to obtain high-quality images, whereas the amount greater than 20 parts by mass tends to result in non-uniform solutions and, thus, a decreased storage stability.

The ArF photoresist suitable for use in the present invention may further contain, in addition to the above-described polymer and the acid-generating agent, a secondary amine or a tertiary amine for the purposes of preventing unnecessary dispersion of the acid generated by exposure to radiation and forming a photoresist pattern faithfully reflecting mask-patterns.

Examples of the secondary amine include aliphatic secondary amines, such as diethylamine, dipropylamine, dibutylamine, and dipentylamine.

Examples of the tertiary amine include aliphatic tertiary amines, such as trimethylamine, triethylamine, tripropylamine, tributylamine, tripentylamine, N,N-dimethylpropylamine, and N-ethyl-N-methylbutylamine; tertiary alkanolamines, such as N,N-dimethylmonoethanolamine, N,N-diethylmonoethanolamine, and triethanolamine; and aromatic tertiary amines, such as N,N-dimethylaniline, N,N-diethylaniline, N-ethyl-N-methylaniline, N,N-dimethyltoluidine, N-methyldiphenylamine, N-ethyldiphenylamine, and triphenylamine.

The secondary or tertiary amines may be used individually or in combinations of two or more. Of these, tertiary alkanolamines are preferred, with lower aliphatic tertiary alkanolamines having 2–4 carbon atoms, such as triethanolamine, being particularly preferred.

The amount of the secondary or tertiary amine is preferably in the range of 0.001–10 parts by mass, more preferably 0.01–1.0 parts by mass, with respect to 100 parts by mass of the polymer. In this manner, the unnecessary dispersion of the acid generated by exposure to light is prevented, so that photoresist patterns faithfully reflecting mask-patterns can be effectively obtained.

If desired, the photoresist may further contain, along with the secondary or tertiary amine, an organic carboxylic acid for the purposes of preventing the sensitivity loss due to the secondary or tertiary amine and further enhancing the resolution.

Examples of such an organic carboxylic acid include a saturated aliphatic carboxylic acid, an alicyclic carboxylic acid, and an aromatic carboxylic acid. Examples of the saturated aliphatic carboxylic acid include monocarboxylic or polycarboxylic acids, such as butyric acid, isobutyric acid, malonic acid, succinic acid, glutaric acid, and adipic acid. Examples of the alicyclic carboxylic acid include 1,1-cyclohexanedicarboxylic acid, 1,2-cyclohexanedicarboxylic acid, 1,3-cyclohexanedicarboxylic acid, 1,4-cyclohexanedicarboxylic acid, and 1,1-cyclohexanediacetic acid. Examples of the aromatic carboxylic acid include aromatic monocarboxylic acids or polycarboxylic acids having substituents such as hydroxyl groups and nitro groups, such as o-, m-, or p-hydroxybenzoic acid, 2-hydroxy-3-nitrobenzoic acid, phthalic acid, terephthalic acid, and isophtalic acid. These organic carboxylic acids may be used individually or in combination of two or more.

Of the organic carboxylic acid, the aromatic carboxylic acid is preferred because of its proper acidity. In particular, o-hydroxybenzoic acid is suitably used since it is highly soluble in photoresist solvents and is suited for forming high-quality photoresist patterns on various substrates.

The amount of the organic carboxylic acid is typically in the range of 0.001–10 parts by mass, and preferably in the range of 0.01–1.0 parts by mass, with respect to 100 parts by mass of the polymer. In this manner, not only is the loss of the sensitivity due to the secondary or tertiary amine prevented, but the resolution can be further improved.

The positive photoresist is preferably used in the form of a solution prepared by dissolving each of the above-described components in a proper solvent. Examples of such a solvent include ketones, such as acetone, methyl ethyl ketone, cyclohexanone, methyl isoamyl ketone and 2-heptanone; polyols and derivatives thereof, such as ethylene glycol, ethylene glycol monoacetate, diethylene glycol, diethylene glycol monoacetate, propylene glycol, propylene glycol monoacetate, dipropylene glycol and dipropylene glycol monoacetate, and monomethylether, monoethylether, monopropylether, monobutylether and monophenylether thereof; cyclic ethers, such as dioxane; and esters, such as methyl lactate, ethyl lactate, methyl acetate, ethyl acetate, butyl acetate, methyl pyruvate, ethyl pyruvate, methyl methoxypropionate, and ethyl ethoxypropionate. These solvents may be used individually or in combination of two or more.

The photoresist may further contain additives that can be mixed therewith, if necessary. For example, additional resins, plasticizer, stabilizer, colors, and surfactants that are commonly in use for improving the performance of the photoresist film may be added.

In one method for forming a pattern using the liquid coating composition for forming an antireflective film of the present invetion, the pattern is formed in the following manner.

First, a photoresist layer is deposited on the surface of a silicon wafer or other proper substrate, and the coating solution is applied on the photoresist layer using the spin-coating method. Then, the substrate is baked to form an antireflective film on the photoresist layer, thus completing a double-layered photoresist laminate. The baking step is not necessary if a uniform, high-quality film can be formed simply by applying the coating solution.

Subsequently, using an exposure apparatus, activation light, such as far ultraviolet radiation, in particular, ArF excimer laser (wavelength=193 nm), is selectively irradiated to the photoresist layer through the antireflective film.

The antireflective film has an optimum thickness that enables it to effectively reduce interference of activation light. This thickness is defined as an odd multiple of $\lambda/4$ n (where $\lambda$ is the wavelength of the activation light, and n is the refractive index of the antireflective film). For example, for the antireflective film with a refractive index of 1.49, the optimum thickness for a far ultraviolet ray (ArF excimer laser) will be odd multiples of 32 nm. In practice, it is desirable that the film thickness fall within a ±5 nm range of the optimum thickness.

According to the present invention, an antireflective film is deposited on top of a chemically amplified positive photoresist layer, which contains as its structural unit a (meth)acrylate unit that has at least one polycyclic hydrocarbon on its side chain and becomes more soluble to alkali by the action of an acid. In this manner, the antireflective film, in addition to exhibiting the antireflective effects, can help improve shapes of photoresist patterns and is thus preferred. In general, surfaces of the layer of the chemically amplified photoresist composition are subjected to a vapor of organic alkaline compounds, such as N-methyl-2-pyrrolidone, ammonia, pyridine, and triethylamine, that exist in the atmosphere of production facilities of semiconductor devices. As a result, the surface of the photoresist layer becomes deprived of acid, which often leads to formation of interconnected 'eaves-like' photoresist patterns or features with T-shaped cross-sections when a positive photoresist is used. The ability of the antireflective film to help improve shapes of photoresist patterns can thus be rephrased as an ability to eliminate occurrences of such phenomena and to thereby make it possible to form photoresist patterns reflecting faithfully the pattern-of-the-mask and their cross-sectional shapes are rectangular. Accordingly, the antireflective film can also serve as a suitable protective material for the chemically amplified photoresist layer.

After exposure and a subsequent post-bake, the photoresist is developed in an alkaline developer solution.

The photoresist for use in the present invention contains a particular type of polymer that includes, as its structural unit, a (meth)acrylate unit that becomes more soluble to alkali by the action of an acid. Therefore, when the acid-generating agent is irradiated with ArF excimer laser to generate an acid, the photoresist in the exposed areas becomes soluble to the alkaline developer solution and is removed by the developer.

Through this series of steps, well-defined photoresist patterns are formed on the silicon wafer.

EXAMPLES

The present invention is now described in a further detail with reference to examples, which are only illustrative and are not intended to limit the scope of the invention in any way.

Example 1

1.0 g of polyvinylpyrrolidone, 2.0 g of perfluorooctylsulfonic acid, 0.1 g of monoethanolamine, and 0.6 g of nonafluorobutanesulfonic acid were dissolved in 150 g of water to prepare a coating composition for forming an antireflective film. The composition contained approximately 2.4% by mass of solid components.

"Tarf-6a-101" (produced by Tokyo Ohka Kogyo Co., Ltd.), a positive photoresist composition and designed for use with ArF laser, was applied onto a substrate, and the substrate was heated at 105° C. for 90 seconds to form a 0.27 µm thick photoresist layer.

The coating composition was then applied on the photoresist layer to form a 33 nm thick antireflective film, thus completing a photoresist laminate.

Using an excimer laser scanner "NSR-S203" (manufactured by Nikon Corp.), the substrate overlaid with the photoresist laminate was exposed to ArF excimer laser and was then heated at 115° C. for 90 seconds. Subsequently, the substrate was developed in a 2.38% by mass aqueous solution of tetramethylammonium hydroxide (TMAH) and was rinsed in pure water.

Observation of the resulting substrate through a scanning electron microscope (SEM) revealed that the resulting photoresist pattern had a finely featured profile, with its cross-section shape being rectangular.

Example 2

1.0 g of polyvinylpyrrolidone/polyvinylimidazole copolymer (polymerization ratio=9:1), 2.0 g of perfluorooctanoic acid, 0.8 g of monoethanolamine, and 1.5 g of nonafluorobutanesulfonic acid were dissolved in 130 g of water to prepare a coating composition for forming an antireflective film. The composition contained approximately 3.9% by mass of solid components.

A photoresist pattern was formed on the substrate in the same manner as in Example 1, except that this coating composition was used.

Observation of the resulting substrate through a scanning electron microscope (SEM) revealed that the resulting photoresist pattern had a finely featured profile, with its cross-section shape being rectangular.

Example 3

1.0 g of polyvinylpyrrolidone, 2.0 g of perfluorooctylsulfonic acid, 0.1 g of monoethanolamine, and 0.6 g of tris(trifluoromethylsufonyl)methane were dissolved in 150 g of water to prepare a coating composition for forming an antireflective film. The composition contained approximately 2.4% by mass of solid components.

A photoresist pattern was formed on the substrate in the same manner as in Example 1, except that this coating composition was used.

Observation of the resulting substrate through a scanning electron microscope (SEM) revealed that the resulting photoresist pattern had a finely featured profile, with its cross-section shape being rectangular.

Comparative Example 1

1.0 g of polyvinylpyrrolidone, 2.0 g of perfluorooctanoic acid, and 0.1 g of monoethanolamine were dissolved in 150 g of water to prepare a coating composition for forming an antireflective film. The composition contained approximately 2.0% by mass of solid components.

A photoresist pattern was formed on the substrate in the same manner as in Example 1, except that this coating composition was used.

Observation of the resulting substrate through a scanning electron microscope (SEM) revealed that the features of the resulting photoresist pattern had overhung, T-shaped top portions.

As set forth, the antireflective film formed of the coating composition of the present invention has numerous advantages in view of the recent trend in the field of semiconductor production toward ultrafine photoresist features: it offers high film quality and film removeability while retaining its characteristics as an antireflective film by which undesirable effects of standing wave are effectively reduced. In this manner, the coating composition of the present invention makes it possible to accurately form a photoresist pattern in which geometrical features have properly edged cross-sections, thus eliminating the problem of T-shaped top portions of the photoresist pattern. The coating composition is particularly effective when used in the formation of ultrafine patterns by ArF laser, which has been difficult by the use of the conventional antireflective film.

What is claimed is:

1. A liquid coating composition for forming an antireflective film overlaid on top of a photoresist layer that contains a polymer, the polymer containing, as a structural unit, a (meth)acrylate unit that has at least one polycyclic hydrocarbon group on its side chain and becomes more soluble to alkali by the action of an acid, the liquid coating composition consisting essentially of:
   (a) a water-soluble, film-forming component;
   (b) at least one fluorine-based compound selected from the group consisting of a perfluoroalkylcarboxylic acid having 4 or more carbon atoms and a perfluoroalkylsulfonic acid having 5 or more carbon atoms; and
   (c): (c-1) at least one member selected from the group consisting of nonafluorobutanesulfonic acid and hexafluoropropanedisulfonic acid and/or (c-2) tris (trifluoromethylsulfonyl) methane.

2. The coating composition according to claim 1, wherein component (b) is at least one selected from the group consisting of perfluorooctanoic acid and perflurooctylsulfonic acid.

3. The liquid coating composition according to claim 1, wherein components (a), (b), and (c) are present in amounts of 0.5–10% by mass, 0.5–20% by mass, and 0.1–1.5% by mass, respectively.

4. A photoresist laminate comprising:
   a photoresist layer containing a polymer, the polymer containing, as a structural unit, a (meth)acrylate unit that have at least one polycyclic hydrocarbon group on its side chain and becomes more soluble to alkali by the action of an acid; and
   an antireflective film deposited on top of the photoresist layer, the antireflective film being formed of the coating composition of claim 1.

5. A method for forming a photoresist pattern, comprising:
   depositing the photoresist laminate of claim 4 on a substrate;
   selectively exposing the photoresist laminate to activation light with a wavelength of 193 nm; and
   developing the photoresist laminate to form a photoresist pattern.

6. The liquid coating composition according to claim 1 consisting of components a), b) and c).

* * * * *